(12) United States Patent
Okazaki et al.

(10) Patent No.: US 7,825,482 B2
(45) Date of Patent: Nov. 2, 2010

(54) SEMICONDUCTOR DEVICE AND METHOD FOR FABRICATING THE SAME

(75) Inventors: Gen Okazaki, Toyama (JP); Akio Sebe, Toyama (JP)

(73) Assignee: Panasonic Corporation, Osaka (JP)

( * ) Notice: Subject to any disclaimer, the term of this patent is extended or adjusted under 35 U.S.C. 154(b) by 110 days.

(21) Appl. No.: 11/969,514

(22) Filed: Jan. 4, 2008

(65) Prior Publication Data

US 2008/0290415 A1    Nov. 27, 2008

(30) Foreign Application Priority Data

May 21, 2007    (JP)    ............... 2007-134069

(51) Int. Cl.
*H01L 29/78*    (2006.01)
(52) U.S. Cl. .............. 257/413; 257/E27.069
(58) Field of Classification Search ............... 257/204, 257/206, 371, 374, 413, E27.062, E27.067, 257/E27.069, E27.108, E29.128
See application file for complete search history.

(56) References Cited

U.S. PATENT DOCUMENTS

| 4,359,816 | A | * | 11/1982 | Abbas et al. | ............... | 438/251 |
| 4,364,166 | A | * | 12/1982 | Crowder et al. | ............... | 438/297 |
| 4,786,611 | A | * | 11/1988 | Pfiester | ............... | 438/233 |
| 4,841,349 | A | * | 6/1989 | Nakano | ............... | 257/75 |
| 5,459,101 | A | * | 10/1995 | Fujii et al. | ............... | 438/621 |
| 5,550,079 | A | * | 8/1996 | Lin | ............... | 438/587 |
| 5,633,523 | A | * | 5/1997 | Kato | ............... | 257/369 |
| 5,892,260 | A | * | 4/1999 | Okumura et al. | ............... | 257/347 |
| 6,008,117 | A | * | 12/1999 | Hong et al. | ............... | 438/629 |
| 6,576,962 | B2 | * | 6/2003 | Rockett | ............... | 257/367 |
| 6,734,498 | B2 | * | 5/2004 | Keshavarzi et al. | ............... | 257/347 |
| 7,361,932 | B2 | * | 4/2008 | Tsuzumitani | ............... | 257/66 |
| 7,528,451 | B2 | * | 5/2009 | Zhu et al. | ............... | 257/385 |
| 2003/0218212 | A1 | * | 11/2003 | Lee et al. | ............... | 257/347 |
| 2004/0026736 | A1 | * | 2/2004 | Grupp et al. | ............... | 257/330 |
| 2004/0120201 | A1 | * | 6/2004 | Ito | ............... | 365/222 |
| 2004/0164305 | A1 | * | 8/2004 | Keshavarzi et al. | ............... | 257/74 |
| 2006/0170036 | A1 | * | 8/2006 | Yilmaz | ............... | 257/329 |
| 2007/0072371 | A1 | * | 3/2007 | Tsuzumitani | ............... | 438/257 |
| 2008/0111163 | A1 | * | 5/2008 | Russ et al. | ............... | 257/280 |
| 2008/0121621 | A1 | * | 5/2008 | Stockum et al. | ............... | 216/97 |
| 2008/0157215 | A1 | * | 7/2008 | Miyashita | ............... | 257/374 |
| 2008/0166868 | A1 | * | 7/2008 | Tsuzumitani | ............... | 438/592 |

(Continued)

FOREIGN PATENT DOCUMENTS

JP    2002-217310    8/2002

*Primary Examiner*—Minh-Loan T Tran
*Assistant Examiner*—Vongsavanh Sengdara
(74) *Attorney, Agent, or Firm*—McDermott Will & Emery LLP

(57) ABSTRACT

A semiconductor device includes: an isolation region formed in a semiconductor substrate; a first active region and a second active region surrounded by the isolation region; an n-type gate electrode and a p-type gate electrode formed on gate insulating films; an insulating film and a silicon region formed on the isolation region and isolating the n-type gate electrode and the p-type gate electrode from each other; and a metal silicide film formed on the upper surfaces of the n-type gate electrode, the silicon region, the p-type gate electrode, and part of the insulating film formed therebetween. The n-type gate electrode is electrically connected to the p-type gate electrode through the metal silicide film.

12 Claims, 4 Drawing Sheets

U.S. PATENT DOCUMENTS

2008/0200036 A1* 8/2008 Stockum et al. ............. 438/756
2009/0090412 A1* 4/2009 Calwer et al. ............... 136/259
2009/0211635 A1* 8/2009 Niira et al. .................. 136/258

* cited by examiner

SEMICONDUCTOR DEVICE AND METHOD FOR FABRICATING THE SAME

CLAIM OF PRIORITY

This application claims the benefit of Japanese Patent Application No. JP 2007-134069, filed on May 21, 2007, the disclosure of which is incorporated herein by reference.

BACKGROUND OF THE INVENTION

1. Field of the Invention

The present invention relates to a semiconductor device, such as a MOSFET (Metal Oxide Semiconductor Field Effect Transistor) having a dual-gate electrode, and a method for fabricating the semiconductor device.

2. Description of the Related Art

With reference FIG. 6, a MOSFET having a dual-gate electrode will be described as a conventional semiconductor device. FIG. 6 is a cross-sectional view illustrating a boundary portion between an n-type MOS region and a p-type MOS region in the conventional MOSFET. As shown in FIG. 6, the conventional MOSFET includes an isolation region 102 formed in a silicon substrate 101; a p-type well region 103 acting as an n-type MOS region and an n-type well region 104 acting as a p-type MOS region, each surrounded by the isolation region 102; a gate oxide film 105 formed over the silicon substrate 101; a dual gate electrode composed of an n-type polysilicon electrode 109A and a p-type polysilicon electrode 109B formed on the gate oxide film 105; and a metal silicide film 112 formed on the n-type polysilicon electrode 109A and the p-type polysilicon electrode 109B. The n-type polysilicon electrode 109A and the p-type polysilicon electrode 109B are formed by forming a polysilicon film on the gate oxide film 105 and then introducing an n-type impurity, such as phosphorus (P), in the n-type MOS region and a p-type impurity, such as boron (B), in the p-type MOS region, respectively.

SUMMARY OF THE INVENTION

In the conventional semiconductor device having the above-described structure, the n-type impurity and the p-type impurity introduced into the boundary portion between the polysilicon electrodes may interdiffuse in the polysilicon, when a heat treatment process is performed after the formation of the n-type polysilicon electrode 109A and the p-type polysilicon electrode 109B. If such impurity interdiffusion in the gate electrodes occurs, the p-type impurity would be introduced into the n-type polysilicon electrode 109A and the n-type impurity would be introduced into the p-type polysilicon electrode 109B, which would result in variations in the transistors' threshold voltage, causing a problem in that intended characteristics cannot be obtained.

In order to address this problem, a MOSFET was proposed as disclosed in Japanese Laid Open Publication No. 2002-217310, for example, in which a tungsten film is added to a dual-gate electrode having a multilayer structure of a polysilicon film and a tungsten silicide film. In this MOSFET, the tungsten silicide film is divided on the boundary portion between the n-type polysilicon electrode and the p-type polysilicon electrode and the divided tungsten silicide films are electrically connected by the tungsten film so as to suppress interdiffusion of the impurities through the interface between the polysilicon film and the tungsten silicide film.

However, in the MOSFET thus structured, the n-type polysilicon electrode and the p-type polysilicon electrode are formed adjacent to each other, and the polysilicon film is not completely separated by the tungsten film. It is thus difficult to prevent the impurities from interdiffusing in the polysilicon film.

It is therefore an object of the present invention to provide a semiconductor device having a dual-gate electrode exhibiting desired characteristics, in which impurities in an n-type gate electrode and a p-type gate electrode are prevented from interdiffusing between the gate electrodes to suppress variation in threshold voltage, and a method for fabricating the semiconductor device.

In order to achieve the object, an inventive semiconductor device includes: a semiconductor substrate; an isolation region formed in the semiconductor substrate; a first active region surrounded by the isolation region and formed of the semiconductor substrate; a second active region surrounded by the isolation region and formed of the semiconductor substrate; a first gate insulating film formed on the first active region; a second gate insulating film formed on the second active region; a first gate electrode of a first conductivity type made of silicon and formed on the first gate insulating film; a second gate electrode of a second conductivity type made of silicon and formed on the second gate insulating film; an insulating film formed on part of the isolation region located between the first active region and the second active region, and isolating the first gate electrode and the second gate electrode from each other; and a metal silicide film formed on the respective upper surfaces of the first gate electrode, the second gate electrode, and the insulating film, wherein the first gate electrode is electrically connected to the second gate electrode through the metal silicide film.

In this structure, since the first gate electrode and the second gate electrode are separated from each other by the insulating film, it is possible to suppress interdiffusion of an impurity of the first conductivity type and an impurity of the second conductivity type between the gate electrodes when a heat treatment is performed at relatively high temperatures in a process step for forming source/drain regions, for example. Furthermore, the metal silicide film formed on the first and second gate electrodes ensures the electrical connection between the first and second gate electrodes without the need for separately providing a wire or the like. Accordingly, in the inventive semiconductor device, interdiffusion of the impurities between the gate electrodes, which would cause variations in the gate electrodes' threshold voltage, is suppressed, thereby enabling the semiconductor device to have a dual-gate electrode exhibiting desired characteristics.

The insulating film may be formed on side faces of the first and second gate electrodes and on the upper surface of the isolation region so as to have a recess-like cross section; the semiconductor device may further include a silicon region formed in a recess surrounded by the insulating film; and the metal silicide film may be formed on the upper surface of the silicon region.

In the case of this structure, the insulating film is provided on the inner surfaces of the opening which isolates the first and second gate electrodes from each other, and the silicon region is formed in the opening. Thus, as in the above-described semiconductor device, the insulating film cuts off the path through which an impurity of the first conductivity type and an impurity of the second conductivity type diffuse, such that interdiffusion of the impurities between the gate electrodes is suppressed. In addition, the metal silicide film is also provided on the silicon region formed in the opening, which ensures the electrical connection between the first and second gate electrodes.

The side faces of the first and second gate electrodes located on the isolation region may form a forward tapered shape with respect to the isolation region. In this case, the opening for isolating the first and second gate electrodes from each other is formed to have a tapered shape. Therefore, as compared with a case in which an opening whose diameter is constant is formed, there is no need for keeping an enough margin for mask misalignment occurring when the opening is formed. It is thus possible to fabricate the inventive semiconductor device with a high yield even if the semiconductor device is reduced in size.

An inventive method for fabricating a semiconductor device includes the steps of: (a) forming an isolation region in a semiconductor substrate and forming a first active region and a second active region, which are surrounded by the isolation region and formed of the semiconductor substrate; (b) forming a first gate insulating film on the first active region and forming a second gate insulating film on the second active region; (c) forming, after the step (b), a first silicon film over the semiconductor substrate; (d) forming an opening on part of the isolation region located between the first and second active regions, the opening passing through the first silicon film; (e) forming an insulating film in the opening; (f) patterning the first silicon film and the insulating film, thereby forming a first gate electrode of a first conductivity type over the first active region with the first gate insulating film interposed therebetween and forming a second gate electrode of a second conductivity type over the second active region with the second gate insulating film interposed therebetween; and (g) forming a metal silicide film on the respective upper surfaces of the first gate electrode, the second gate electrode, and the insulating film, wherein the first gate electrode is electrically connected to the second gate electrode through the metal silicide film.

According to this method, the insulating film formed in the opening in the step (e) isolates the first and second gate electrodes from each other. Thus, when a high-temperature heat treatment, for example, is performed after the step (e), interdiffusion of an impurity of the first conductivity type and an impurity of the second conductivity type between the gate electrodes is suppressed. As a result, it is possible to suppress variations in the threshold voltage of the first and second gate electrodes, enabling the fabrication of a semiconductor device having a dual-gate electrode exhibiting desired characteristics.

DETAILED DESCRIPTION OF THE INVENTION

First Embodiment

Figure 1:
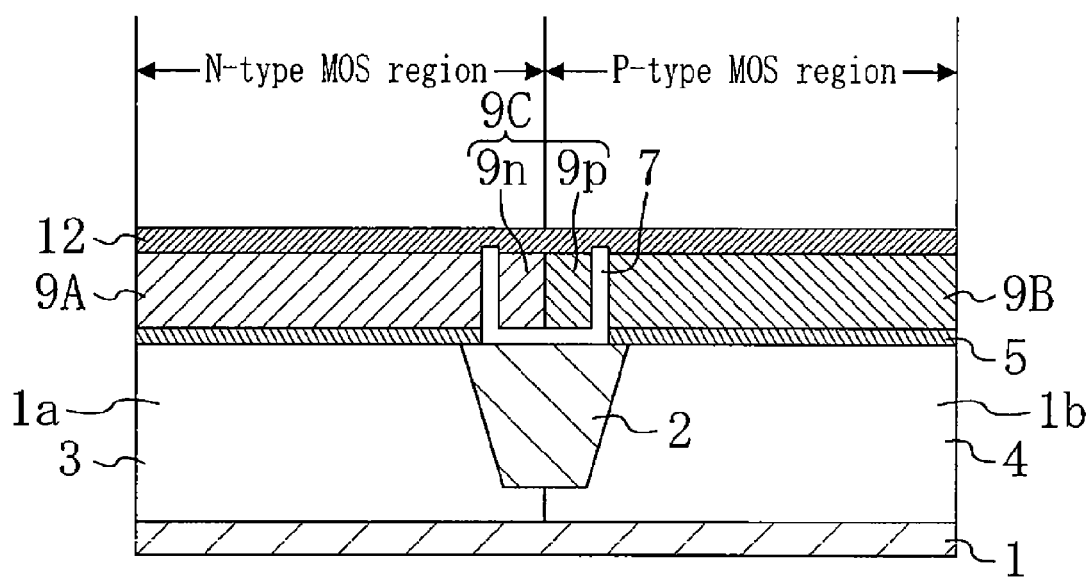
FIG. 1 is a cross-sectional view illustrating the structure of a semiconductor device according to a first embodiment of the invention.

Hereinafter, a semiconductor device and a method for fabricating the semiconductor device according to a first embodiment of the invention will be described with reference to the accompanying drawings. FIG. 1 is a cross-sectional view in a gate-width direction, illustrating the structure of the semiconductor device according to the first embodiment of the invention. A MOSFET having a dual-gate electrode will be described as the inventive semiconductor device.

As shown in FIG. 1, the semiconductor device according to this embodiment includes a semiconductor substrate 1 made of silicon or the like; an isolation region 2 formed in the semiconductor substrate 1 by an STI (Shallow Trench Isolation) technique or the like; a p-type well 3 formed in an n-type MOS region in the semiconductor substrate 1; an n-type well 4 formed in a p-type MOS region in the semiconductor substrate 1; a first active region 1a surrounded by the isolation region 2 in the semiconductor substrate 1 (the p-type well 3); a second active region 1b surrounded by the isolation region 2 in the semiconductor substrate 1 (the n-type well 4); a gate insulating film 5 formed on the first and second active regions 1a and 1b; an n-type gate electrode 9A formed over the first active region 1a with the gate insulating film 5 interposed therebetween and made of polysilicon into which an n-type impurity, e.g., phosphorus, has been introduced; and a p-type gate electrode 9B formed over the second active region 1b with the gate insulating film 5 interposed therebetween and made of polysilicon into which a p-type impurity, e.g., boron, has been introduced.

Furthermore, in the semiconductor device according to this embodiment, the n-type gate electrode 9A and the p-type gate electrode 9B are spaced apart from each other on the isolation region 2 located between the first and second active regions 1a and 1b. On part of the isolation region 2 located between the n-type gate electrode 9A and the p-type gate electrode 9B, an insulating film 7 and a silicon region 9C are provided. The insulating film 7 is formed of an oxide film or the like on the side faces of the n-type gate electrode 9A and p-type gate electrode 9B and on the upper surface of the isolation region 2, and has the shape of a recess in cross section. The silicon region 9C is formed in the recess surrounded by the insulating film 7. And a metal silicide film 12 made of cobalt silicide or the like is formed on the upper surfaces of the n-type gate electrode 9A, silicon region 9C, p-type gate electrode 9B, and part of the insulating film 7 exposed therebetween, such that the metal silicide film 12 electrically connects the n-type gate electrode 9A and the p-type gate electrode 9B. The silicon region 9C includes an n-type silicon region 9n and a p-type silicon region 9p, for example, but is not limited to this.

The semiconductor device of this embodiment is characterized in that the n-type gate electrode 9A and the p-type gate electrode 9B are isolated from each other by the insulating film 7 and the silicon region 9C and that the metal silicide film 12 is formed on the n-type gate electrode 9A and the p-type gate electrode 9B as well as on the insulating film 7 and the silicon region 9C. This structure provides the following effects. First, since the n-type gate electrode 9A and the p-type gate electrode 9B are separated by the insulating film 7, it is possible to suppress interdiffusion of the impurities introduced into the n-type gate electrode 9A and the p-type gate electrode 9B, when a heat treatment is performed at relatively high temperatures in a process step for forming source/drain regions, for example. Moreover, the metal silicide film 12 formed continuously on the n-type gate electrode 9A and the p-type gate electrode 9B ensures the electrical connection between the n-type gate electrode 9A and the p-type gate electrode 9B without the need for separately providing a wire or the like. Hence in the semiconductor device of this embodiment, it is possible to suppress interdiffusion of the impurities of the different conductivity types between the gate electrodes, which enables the semiconductor device to have a dual-gate electrode exhibiting an intended threshold voltage.

Next, a method for fabricating the semiconductor device according to this embodiment will be described with reference to FIGS. 2 and 3. FIGS. 2A to 2E and FIGS. 3A to 3C are cross-sectional views illustrating the semiconductor device fabrication method according to the first embodiment of the invention.

Figure 2A:
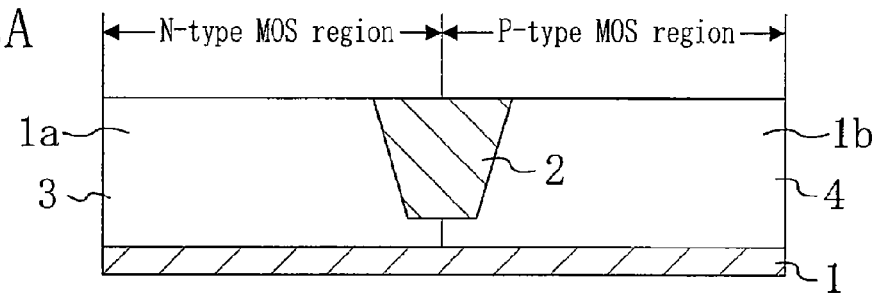
FIGS. 2A to 2E are cross-sectional views illustrating a semiconductor device fabrication method according to the first embodiment.

First, as shown in FIG. 2A, an isolation region 2 is formed in a semiconductor substrate 1 made of silicon or the like by filling a trench having a depth of 300 nm with an insulating film, such as a silicon oxide film, using a shallow trench isolation (STI) technique, for example. By this process step, a first active region 1a and a second active region 1b formed of the semiconductor substrate 1 and surrounded with the isolation region 2 are formed. Then, ions of a p-type impurity, e.g., boron (B), are selectively implanted into an n-type MOS region in the semiconductor substrate 1 to form a p-type well 3, while ions of an n-type impurity, e.g., phosphorus (P), are selectively implanted into a p-type MOS region in the semiconductor substrate 1 to form an n-type well 4. The p-type well 3 and the n-type well 4 are formed to be deeper than the isolation region 2, and the region in the p-type well 3 surrounded with the isolation region 2 functions as the first active region 1a of an n-type MOS transistor, while the region in the n-type well 4 surrounded with the isolation region 2 functions as the second active region 1b of a p-type MOS transistor.

Figure 2B:
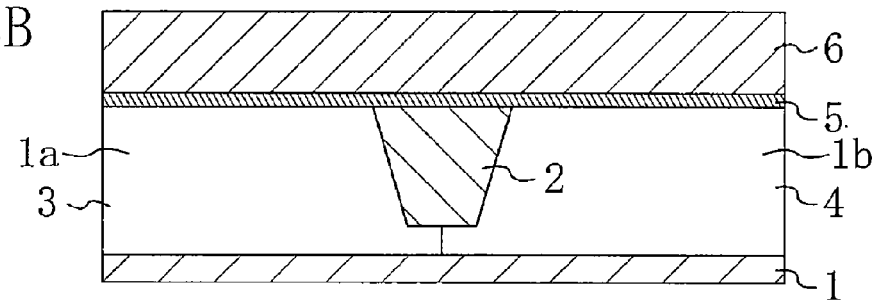

Next, as shown in FIG. 2B, a gate insulating film 5, which has a thickness of from 1 to 5 nm, e.g., and is an oxide silicon film or the like, is formed over the entire surface of the semiconductor substrate 1 by a thermal oxidation process. Thereafter, a first silicon film 6 made of polysilicon or the like and having a thickness of from 50 to 150 nm, for example, is formed on the gate insulating film 5.

Figure 2C:
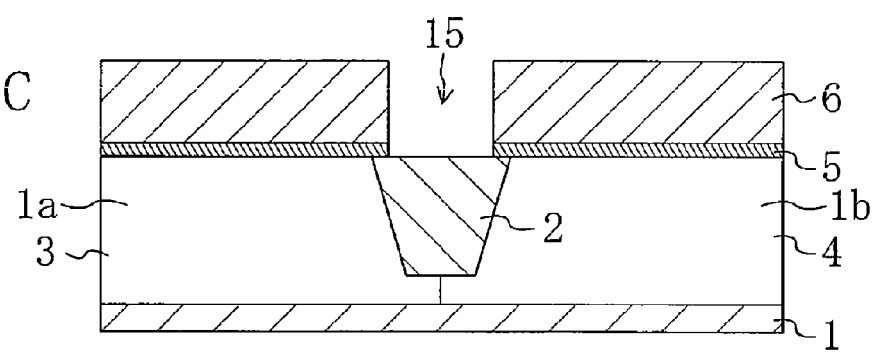

Subsequently, as shown in FIG. 2C, part of the first silicon film 6 formed in the boundary portion between the n-type MOS region and the p-type MOS region is etched anisotropically and removed, thereby forming an opening 15 which goes through the first silicon film 6 to reach the upper surface of the isolation region 2.

Figure 2D:
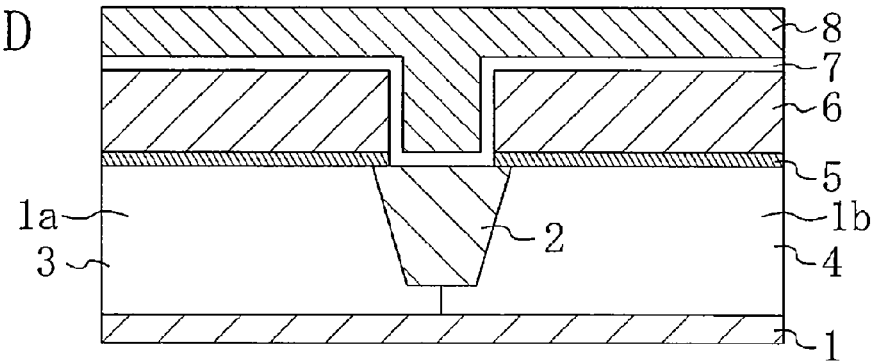

Next, as shown in FIG. 2D, an insulating film 7, which has a thickness of from 5 to 15 nm, for example, and is an oxide film, a nitride film or the like, is formed on the inner surfaces of the opening 15 as well as on the first silicon film 6. Then, a second silicon film 8 made of polysilicon or the like is deposited on the insulating film 7, thereby filling the opening 15 with the second silicon film 8.

Figure 2E:
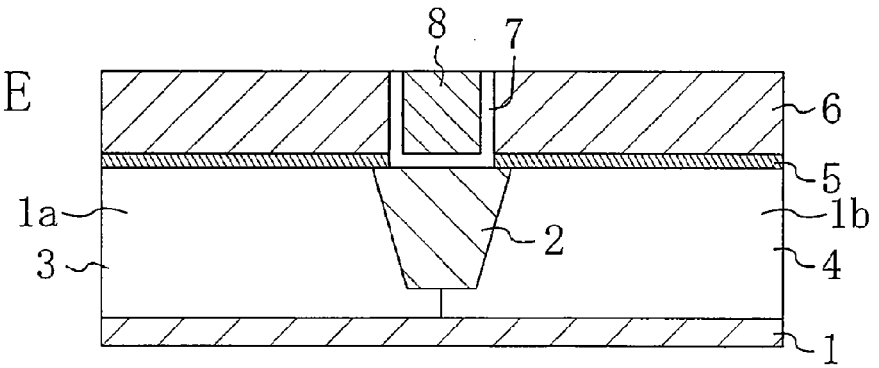

Subsequently, as shown in FIG. 2E, the second silicon film 8 and the insulating film 7 are removed by a CMP (Chemical Mechanical Polishing) process or the like until the upper surface of the first silicon film 6 is exposed. Alternatively, the second silicon film 8 may be removed by a CMP process until the upper surface (the upper end) of the insulating film 7 is exposed, and then the exposed insulating film 7 may be etched to expose the upper surface of the first silicon film 6.

Figure 3A:
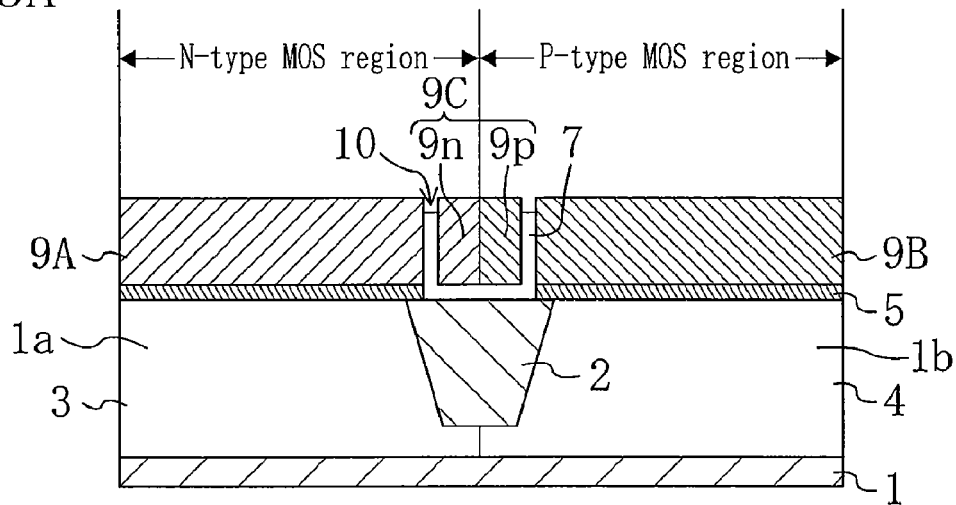
FIGS. 3A to 3C are cross-sectional views illustrating the semiconductor device fabrication method according to the first embodiment.

Next, as shown in FIG. 3A, the upper surface (the upper end) of the insulating film 7 is etched by a thickness of from 10 nm to 30 nm, for example, to form a recess 10. By this etching, the upper surface (the upper end) of the insulating film 7 becomes lower than the upper surface of the first silicon film 6. Then, an n-type impurity, e.g., P, is introduced into the first and second silicon films 6 and 8 formed in the n-type MOS region, whereby an n-type gate electrode 9A is formed over the first active region 1a while an n-type silicon region 9n is formed in the opening 15. And a p-type impurity, e.g., B, is introduced into the first and second silicon films 6 and 8 formed in the p-type MOS region, whereby a p-type gate electrode 9B is formed while a p-type silicon region 9p is formed in the opening 15. It should be noted that the silicon region 9C is not necessarily composed of the n-type silicon region 9n and the p-type silicon region 9p, but the entire silicon region 9C may be formed of the n-type silicon region 9n or the p-type silicon region 9p. Alternatively, the silicon region 9C may be a non-doped silicon region. It should also be noted that the process step of forming the n-type gate electrode 9A and the p-type gate electrode 9B may be performed prior to the process step of forming the recess 10 in the insulating film 7.

Subsequently, although not shown, the n-type gate electrode 9A and the p-type gate electrode 9B are formed into a gate electrode pattern shape by using lithography and anisotropic etching techniques. Thereafter, with the patterned n-type gate electrode 9A used as a mask, an n-type impurity is introduced into the first active region 1a to form an n-type extension region, while, with the patterned p-type gate electrode 9B used as a mask, a p-type impurity is introduced into the second active region 1b to form a p-type extension region. Next, an insulating film is formed over the entire surface of the semiconductor substrate 1 by a CVD process and then etched anisotropically, thereby forming a sidewall spacer film on the sidewalls of the patterned n-type gate electrode 9A and p-type gate electrode 9B. Then, with the patterned n-type gate electrode 9A and the sidewall spacer film used as a mask, an n-type impurity is introduced into the first active region 1a to form n-type source/drain regions, while, with the patterned p-type gate electrode 9B and the sidewall spacer film used as a mask, a p-type impurity is introduced into the second active region 1b to form p-type source/drain regions.

Figure 3B:
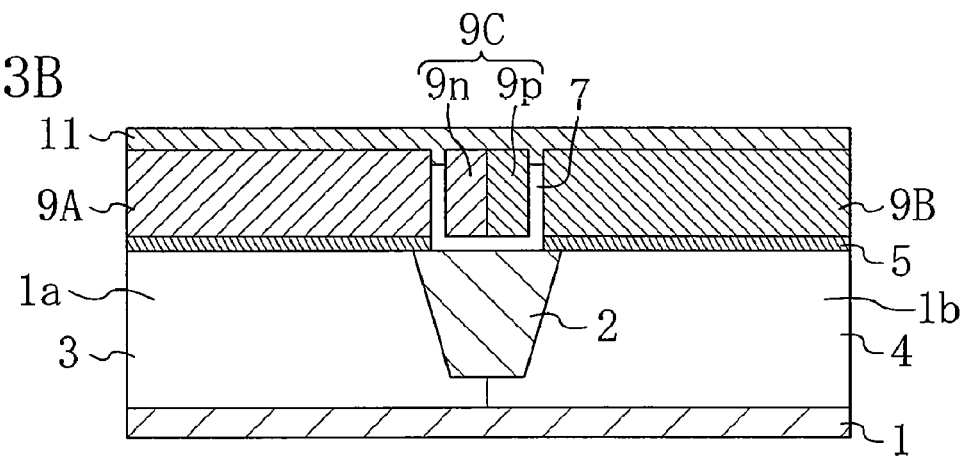

Then, as shown in FIG. 3B, a metal film 11, made of nickel (Ni) or the like and having a thickness of from 5 to 15 nm, for example, is formed over the entire surface of the semiconductor substrate 1. In this process step, the recess 10 in the insulating film 7 formed in the process step shown in FIG. 3A is also filled with the metal film 11. It should be noted that the metal film 11 may be made of other metal such as cobalt (Co). Next, the semiconductor substrate 1 is heat-treated, which causes reaction to occur between the metal film 11 and the silicon films forming the n-type gate electrode 9A, the p-type gate electrode 9B and the silicon region 9C, thereby forming a metal silicide film 12 on the n-type gate electrode 9A, the p-type gate electrode 9B, and the silicon region 9C. At this time, the metal silicide film 12, extending out from both the n-type gate electrode 9A and the silicon region 9C and extending out from both the silicon region 9C and the p-type gate electrode 9B, is also formed on the insulating film 7 in the recess 10. Thus, the first gate electrode 9A and the second gate electrode 9B are electrically connected by the metal silicide film 12. Although not shown, the metal silicide film 12 is also formed on the n-type source/drain regions and the p-type source/drain regions.

Thereafter, as in a typical MOSFET fabrication method, although not shown, an interlayer insulating film having a multilayer structure composed of a silicon nitride film and a silicon oxide film is formed over the entire surface of the semiconductor substrate 1, for example, by a CVD process. Next, the interlayer insulating film is planarized by a CMP process, and then a contact hole is formed, which reaches the upper surfaces of the source/drain regions and gate electrodes. Subsequently, a multilayer film (a barrier film), having a small thickness and made of titanium (Ti) and titanium nitride (TiN), for example, is formed on the inner surfaces of the contact hole. The contact hole is then filled with a tungsten (W) film, thereby fabricating a MOSFET. By the above method, the semiconductor device having the dual-gate electrode according to this embodiment is fabricated.

The semiconductor device fabrication method according to this embodiment is characterized in that, in the process step shown in FIG. 2C, the part of the first silicon film 6 located in the boundary portion between the n-type MOS region and the p-type MOS region is removed to form the opening 15, and then the insulating film 7 and the second silicon film 8 are formed in the opening 15. According to this method, the insulating film 7 and the silicon region 9C formed in the opening 15 provide isolation between the n-type gate electrode 9A and the p-type gate electrode 9B formed in the process step shown in FIG. 3A. Thus, when a high-temperature heat treatment, for example, is performed in a later process step, the impurities introduced into the n-type gate electrode 9A and the p-type gate electrode 9B are prevented from interdiffusing. Accordingly, it is possible to suppress variations in the threshold voltage of the n-type gate electrode 9A and p-type gate electrode 9B, hence enabling the fabrication of the semiconductor device having the dual-gate electrode exhibiting desired characteristics.

Figure 3C:
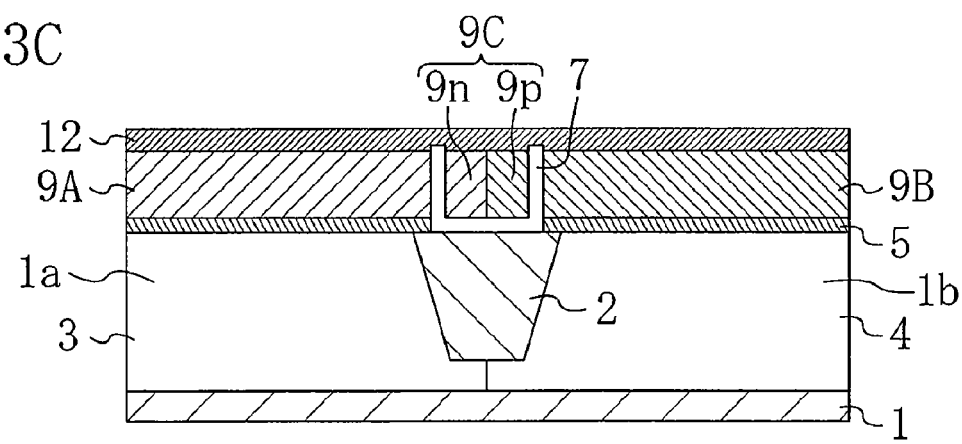

Furthermore, in the semiconductor device fabrication method according to this embodiment, the recess 10 is formed on the upper end of the insulating film 7 in the process step shown in FIG. 3A, so that the n-type gate electrode 9A and the p-type gate electrode 9B formed around the upper end of the insulating film 7 sufficiently react with the metal film 11 in the process step shown in FIG. 3C, which allows the metal silicide film 12 to be reliably formed on the insulating film 7 as well. As a result, it is possible to prevent part of the metal film 11 from being left unreacted, and the electrical connection between the n-type gate electrode 9A and the p-type gate electrode 9B is thus ensured reliably, enabling the highly reliable semiconductor device to be fabricated. It should be noted that the process step of forming the recess does not necessarily have to be performed. As in the semiconductor device fabrication method of this embodiment, if the insulating film 7 is formed to have a relatively thin film thickness, e.g., 5 to 15 nm, the metal silicide film 12 may be formed on the insulating film 7 without forming a recess.

Second Embodiment

Figure 4:
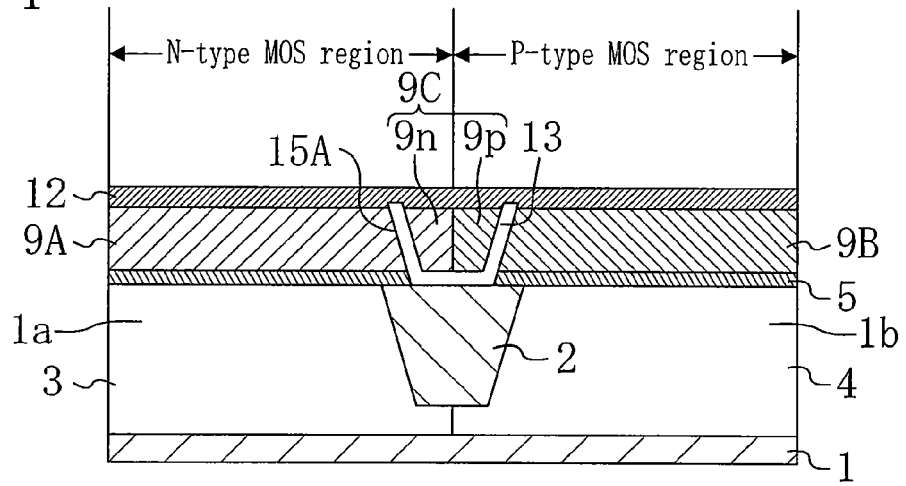
FIG. 4 is a cross-sectional view illustrating the structure of a semiconductor device according to a second embodiment of the invention.

Hereinafter, a semiconductor device and a method for fabricating the semiconductor device according to a second embodiment of the invention will be described with reference to the accompanying drawings. FIG. 4 is a cross-sectional view illustrating the structure of the semiconductor device according to this embodiment.

As shown in FIG. 2C, in the above-described semiconductor device according to the first embodiment, the opening 15 provided between the n-type gate electrode 9A and the p-type gate electrode 9B is formed so that the side faces of the n-type gate electrode 9A and p-type gate electrode 9B are almost perpendicular to the isolation region 2. Thus, the insulating film 7 is formed to have the shape of a recess in which the lateral regions thereof are substantially perpendicular to the bottom region. In contrast, as shown in FIG. 4, in the semiconductor device according to this embodiment, an opening 15A provided between an n-type gate electrode 9A and a p-type gate electrode 9B is formed so that the side faces of the n-type gate electrode 9A and p-type gate electrode 9B form a forward tapered shape with respect to an isolation region 2. Consequently, an insulating film 13 formed on the inner surfaces of the opening 15A is formed in such a manner that the lateral regions form an inverse tapered shape with respect to the bottom region. In all respects other than the insulating film 13, the semiconductor device according to this embodiment has the same structure as the semiconductor device of the first embodiment.

In the structure of the semiconductor device according to this embodiment, as in the semiconductor device according to the first embodiment, the n-type gate electrode 9A and the p-type gate electrode 9B are isolated from each other by a silicon region 9C and the insulating film 13, and the n-type gate electrode 9A and the p-type gate electrode 9B are electrically connected thorough a metal silicide film 12. Hence, even if a high-temperature heat treatment is performed, interdiffusion of impurities introduced into the gate electrodes is suppressed, permitting the n-type gate electrode 9A and the p-type gate electrode 9B to exhibit intended characteristics. As a consequence, a semiconductor device having a highly reliable dual-gate electrode is obtainable.

Moreover, in the semiconductor device according to this embodiment, the n-type gate electrode 9A and the p-type gate electrode 9B are formed so that their side faces have a forward tapered shape with respect to the isolation region 2. This eliminates the need for keeping an enough margin for mask misalignment occurring when the opening 15A is formed in a first silicon film 6 and for mask misalignment occurring when impurities are introduced into the first silicon film 6 to form the gate electrodes, for example, such that the semiconductor device is fabricated with a high yield even if the semiconductor device is reduced in size.

If the opening 15 is formed to have a forward tapered shape with respect to the isolation region 2 in the process step shown in FIG. 2C in the above-described semiconductor device fabrication method of the first embodiment, the semiconductor device of this embodiment can be fabricated in the same manner as the semiconductor device fabrication method of the first embodiment.

Third Embodiment

Figure 5:
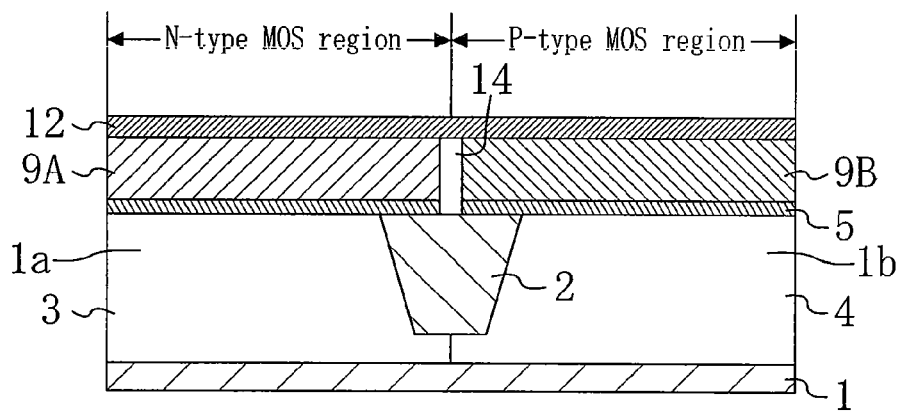
FIG. 5 is a cross-sectional view illustrating the structure of a semiconductor device according to a third embodiment of the invention.
Figure 6:
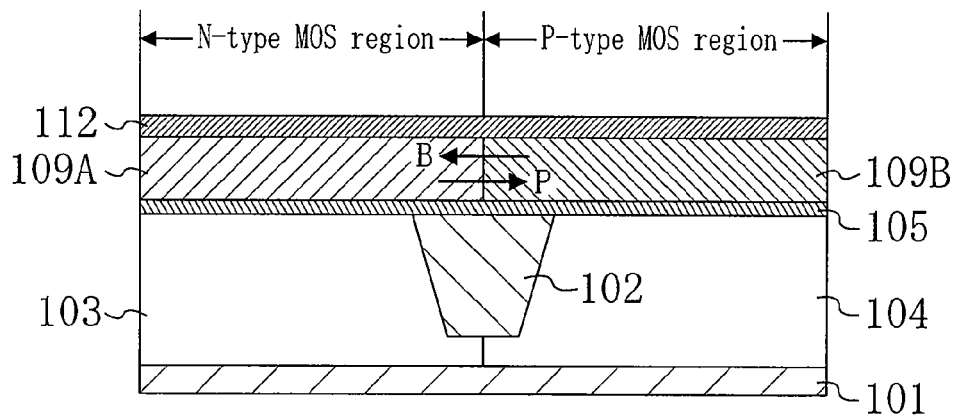
FIG. 6 is a cross-sectional view illustrating the structure of a conventional semiconductor device.

Hereinafter, a semiconductor device and a method for fabricating the semiconductor device according to a third embodiment of the invention will be described with reference to the accompanying drawings. FIG. 5 is a cross-sectional view illustrating the structure of the semiconductor device according to this embodiment.

As shown in FIG. 1, in the above-described semiconductor device of the first embodiment, the n-type gate electrode 9A and the p-type gate electrode 9B are separated by the insulating film 7 and the silicon region 9C. In contrast, in the semiconductor device according to this embodiment, an n-type gate electrode 9A and a p-type gate electrode 9B are separated by an insulating film 14 alone, as shown in FIG. 5.

Specifically, the semiconductor device according to this embodiment includes: a semiconductor substrate 1, in which an isolation region 2, a p-type well 3, an n-type well 4, a first active region 1a, and a second first active region 1b are formed; a gate insulating film 5 formed on the first active region 1a, the second active region 1b, and the isolation region 2; an n-type gate electrode 9A formed on the gate insulating film 5 on the first active region 1a; a p-type gate electrode 9B formed on the gate insulating film 5 on the second active region 1b; an insulating film 14 formed on the isolation region 2 located between the first active region 1a and the second active region 1b and interposed between the n-type gate electrode 9A and the p-type gate electrode 9B; and a metal silicide film 12 made of cobalt silicide or the like and formed on the upper surfaces of the n-type gate electrode 9A, p-type gate electrode 9B, and insulating film 14 provided therebetween. The metal silicide film 12 electrically connects the n-type gate electrode 9A and the p-type gate electrode 9B.

In the semiconductor device according to this embodiment having the structure described above, the n-type gate electrode 9A and the p-type gate electrode 9B are also isolated from each other by the insulating film 14 and are electrically connected through the metal silicide film 12. Thus, when a high-temperature heat treatment is performed, it is possible to suppress interdiffusion of the impurities introduced into the n-type gate electrode 9A and the p-type gate electrode 9B.

The semiconductor device according to this embodiment is fabricated in the following manner. In the process step shown in FIG. 2C in the above-described semiconductor device fabrication method of the first embodiment, a narrow groove having an opening width of from 5 to 15 nm, for example, is formed in the boundary portion between the p-type MOS region and the n-type MOS region, and the groove is then filled with an oxide film or a nitride film, thereby forming the insulating film 14. Thereafter, as in the semiconductor device fabrication method of the first embodiment, the n-type gate electrode 9A, the p-type gate electrode 9B, source/drain regions (not shown) and the like are formed.

Subsequently, a metal film 11 is deposited over the entire surface of the semiconductor substrate 1, and then the semiconductor substrate 1 is heat-treated to form the metal silicide film 12 on the n-type gate electrode 9A and the p-type gate electrode 9B. At this time, since the space between the first gate electrode 9A and the second gate electrode 9B is relatively small, which is from 5 to 15 nm, the metal silicide film 12 extending out from both the n-type gate electrode 9A and the p-type gate electrode 9B as a result of the silicide reaction is also formed on the insulating film 14. The first gate electrode 9A and the second gate electrode 9B are thus electrically connected by the metal silicide film 12. It should be noted that, as in the semiconductor device fabrication method according to the first embodiment, a recess may be formed on the upper end of the insulating film 14. In that case, it is possible to form the metal silicide film 12 on the insulating film 14 more reliably. Thereafter, by performing the same process steps as those for the semiconductor device of the first embodiment, the semiconductor device of this embodiment is fabricated.

In the semiconductor device fabrication method according to this embodiment, unlike in the semiconductor device fabrication method according to the first embodiment, a second polysilicon film (see FIG. 2D) does not have to be formed, which allows the process steps to be simplified as compared with the semiconductor device fabrication method of the first embodiment. As a result, variation in threshold voltage is suppressed, making it possible to fabricate a semiconductor device having a highly reliable dual-gate electrode in a relatively easy manner.

As described previously, the semiconductor devices and the methods for fabricating the semiconductor devices according to the invention are applicable to semiconductor devices having a dual-gate electrode, for example.

What is claimed is:

1. A semiconductor device comprising:
 a semiconductor substrate;
 an isolation region formed in the semiconductor substrate;
 a first active region surrounded by the isolation region and formed of the semiconductor substrate;
 a second active region surrounded by the isolation region and formed of the semiconductor substrate;
 a first gate insulating film formed on the first active region;
 a second gate insulating film formed on the second active region;
 a first gate electrode of a first conductivity type made of silicon and formed on the first gate insulating film;
 a second gate electrode of a second conductivity type made of silicon and formed on the second gate insulating film;
 an insulating film formed on an upper surface of a part of the isolation region located between the first active region and the second active region, and sandwiched between the first gate electrode and the second gate electrode so as to have a recess-like cross section in the gate width direction and being made of a single film;
 a silicon region surrounded by the insulating film and formed in a recess; and
 a metal silicide film formed on the respective tops of the first gate electrode, the second gate electrode, the silicon region, and the insulating film,
 wherein the first gate electrode is electrically connected to the second gate electrode through the metal silicide film, and
 the first and second gate electrodes are separated by the insulating film and the silicon region.

2. The semiconductor device of claim 1, wherein the side faces of the first and second gate electrodes located on the isolation region form a forward tapered shape with respect to the isolation region.

3. The semiconductor device of claim 1, wherein the insulating film is an oxide film or a nitride film.

4. The semiconductor device of claim 1, wherein the insulating film is formed in contact with the upper surface of the isolation region.

5. The semiconductor device of claim 1, wherein the insulating film has a thickness of 5-15 nm.

6. The semiconductor device of claim 1, wherein the metal silicide film is made of cobalt silicide.

7. The semiconductor device of claim 1, wherein the first and second gate electrodes are made of a same polysilicon material.

8. The semiconductor device of claim 1, wherein
 the first gate electrode is made of polysilicon doped with n-type impurities,
 the second gate electrode is made of polysilicon doped with p-type impurities, and
 the silicon region is made of polysilicon doped with n-type and p-type impurities.

9. The semiconductor device of claim 1, wherein the top of the insulating film is located higher than upper surfaces of the first and second gate electrodes.

10. The semiconductor device of claim 1, wherein part of the metal silicide film located on the top of the insulating film has a smaller thickness than part of the metal silicide film located on upper surfaces of the first and second gate electrodes.

11. The semiconductor device of claim 1, wherein the first and second gate insulating films are made of a same silicon oxide material.

12. The semiconductor device of claim 1, wherein the silicon region is isolated from the first gate electrode and the second electrode by the insulating film.

* * * * *